United States Patent
Chalupka et al.

(10) Patent No.: US 6,194,730 B1
(45) Date of Patent: Feb. 27, 2001

(54) ELECTROSTATIC LENS

(75) Inventors: Alfred Chalupka, Vienna; Gerhard Stengl, Wernberg, both of (AT)

(73) Assignee: IMS-Ionen Mikrofabrikations Systeme GmbH, Vienna (AT)

( * ) Notice: Subject to any disclaimer, the term of this patent is extended or adjusted under 35 U.S.C. 154(b) by 0 days.

(21) Appl. No.: 09/186,865

(22) Filed: Nov. 5, 1998

(30) Foreign Application Priority Data

Nov. 5, 1997 (AT) .................................... 1872/97

(51) Int. Cl.[7] .............................. H01J 37/12; H01J 42/22
(52) U.S. Cl. .................. 250/396 R; 250/305; 313/361.1
(58) Field of Search ............................... 250/396 R, 305; 313/361.1

(56) References Cited

U.S. PATENT DOCUMENTS 5,869,838 * 2/1999 Stengl ............................. 250/396 R
5,929,452 * 7/1999 Yoshitake et al. ............... 250/396 R

* cited by examiner

Primary Examiner—Bruce C. Anderson
Assistant Examiner—Nikita Wells
(74) Attorney, Agent, or Firm—Thomas R. Vigil

(57) ABSTRACT

Electrostatic lens for focussing the beams of charged particles, more particularly of ions, which have electrodes being designed as an electric conductor with a ring-shaped section, the inner edge of which is essentially circular, whereas at least one of the electrodes is composed of sector areas (4) succeeding one another along the periphery of an electrode, whereas

- each sector area is covering one predetermined angle area of the periphery,
- the sector areas are electrically connected to one another and
- the sector areas are linked to the holding device via at least one adjusting element per sector area
- the position of the sector areas may be adjusted irrespective of the other sector areas by means of the adjusting elements during operation of the electrostatic lens.

The sector areas may be mechanically separated or extend from one thickness minimum of an electrode cross-section with periodically varying thickness to the next one.

10 Claims, 3 Drawing Sheets

ELECTROSTATIC LENS

BACKGROUND OF THE INVENTION

1. Field of the Invention

The present invention relates to an electrostatic lens for focusing the beams of charged particles, more particularly of ions, which have at least two electrodes being designed as an electric conductor with a ring-shaped section, the inner edge of which is essentially circular, whereas each electrode is connected to a power supply, can be connected to an electric potential and is fastened on a holding device.

2. Description of the Prior Art

Electrostatic lenses are used in particle optical systems and may be used for multi-various applications. Of particular interest is the application of ion beam lithography used in structure semiconductors. In the case of ion beam lithography, an ion beam pictures the structures of a shadow mask on a wafer in a usually reduced picture. In order to produce a well defined picture of the mask structures on the wafer with the help of the ion beam, the ion beam is led through an imaging system in which a number of electrodes held at different electrostatic potentials are combined into electrostatic lenses.

Due to the extraordinarily high requirements expected in the production of semiconductors, the electrostatic field in ion beam lithography has to be very accurately defined in the areas traversed by the ion beam. The efficiency of such a physical system is thus essentially dependent on the fact that the actual electrostatic fields are corresponding with the set points. This means that on one hand, the shape of the electrodes—which is usually radial symmetric—and their spacing is "perfect" and, on the other hand, that all the parts of the projection system have to be "perfectly" aligned. The production of such a "perfect" system is implying considerable measures and costs. Furthermore, in case of a defect or a change in shape or alignment of the electrodes, for example, due to environmental factors, the repair or realignment of the system is particularly difficult.

If, during the mounting of an ion beam lithography installation, inaccuracies in production or misalignments are making their appearance, the image will be faulty also. Thanks to electric or magnetic multipole fields, the correction of image distortions is possible and well known to those skilled in the art.

In U.S. Pat. No. 2,919,381, multipole electrodes are used to correct image distortions. Such a multipole electrode is divided into sectors functioning as partial electrodes and having their own power supply. In feeding potential differences between the partial electrodes of a multipole electrode, a multipole field is being produced that corrects partially the different image distortions.

U.S. Pat. No. 4,963,748 teaches combining multipole electrodes longitudinally, thus further improving the image accuracy, as well as electrodes having a rotationally symmetrical basic shape and presenting, among others, advantages in manufacturing techniques.

In a multipole electrode of the type mentioned above, each partial electrode has to be connected individually to a supply point and has to be triggered by it. This may imply considerable measures. Moreover, the potential difference between adjacent partial electrodes may lead to big field intensities which are occurring particularly on the edges of the partial electrode of an essentially rotationally symmetrical electrode.

SUMMARY OF THE INVENTION

The present invention provides a type of electrodes which concede, adjust and correct processes on the electrostatic field even after installation, particularly after initiation of the particle optical system, so that the image, in the case of a lithography installation of the mask on the wafer is provided at the required quality.

Further, the present invention provides an electrostatic lens of the type mentioned above in which at least one of the electrodes is composed of sector areas succeeding one another along the periphery of an electrode, whereas

- each sector area is covering one predetermined angle area of the periphery,
- the sector areas are electrically connected to one another,
- sector areas are linked to the holding device via at least one adjusting element per sector area, and
- the position of said sector areas may be adjusted independent of the other sector areas by means of the adjusting elements during operation of the electrostatic lens.

This solution, thanks to the change of position of the sector areas of the electrode, allows influence on the spatial distribution of the electric potential without having to change the potentials of the partial electrodes and the possibilities regarding the approachable multipole fields remain the same. The mechanical precision adjusting of the electrodes or of the partial electrodes needs no more to be done during the assembly of the lithography installation. It may be postponed until after initiation and may be amended later on at any time when needed, even during operation.

In one preferred embodiment of the invention, the sector areas are each covering an angle area of the periphery with each angle area having the same size. This facilitates the production of the electrode elements whereas, thanks to the thus achieved symmetry, the control of the field distributions becomes far less complicated.

In order to achieve an effective influence on the electric potential, it is propitious if the sector areas whose position are adjustable, are adjustable by means of the adjusting elements at least in a radial direction.

For an accurate definition not only of the position but also of the alignment of the sector areas, it is moreover advantageous if the sector areas, whose positions are adjustable, are assigned at least two adjusting elements each and they are arranged in a longitudinal direction relative to one another.

It is hereby particularly advantageous if the sector areas, whose position are adjustable, are additionally adjustable by means of the adjusting elements at least in their tilting relative to the longitudinal axis of the electrostatic lens.

In another embodiment of the invention each sector area is advantageously linked to the holding device via at least one adjusting element and is adjustable in its position by means of at least one adjusting element during operation of the electrostatic lens, irrespective of the other sector areas.

In still another advantageous embodiment that additionally tolerates the influence on the potential distribution in a z direction sector areas are longitudinally divided into segments, whereas

- each segment is occupying a predetermined longitudinal area,
- the segments are connected to the common power supply,
- segments are linked to the holding device via at least one adjusting element, and
- the position of said segments is individually adjustable by means of the adjusting elements during operation of the electrostatic lens.

In one embodiment, the sector areas and/or segments are mechanically separated. This facilitates among others their mechanical motion relative to each other.

In another embodiment, the sector areas and/or the segments are advantageously mechanically connected to one another on the inner surface of the electrode by electric connections, so that potential unsteadiness along said inner surface is avoided.

In a particularly preferred embodiment, an electrode cross-section with periodically variable thickness is provided, whereas each sector area is extending from one thickness minimum to the next one.

DESCRIPTION OF THE PREFERRED EMBODIMENT(S)

Figure 1:
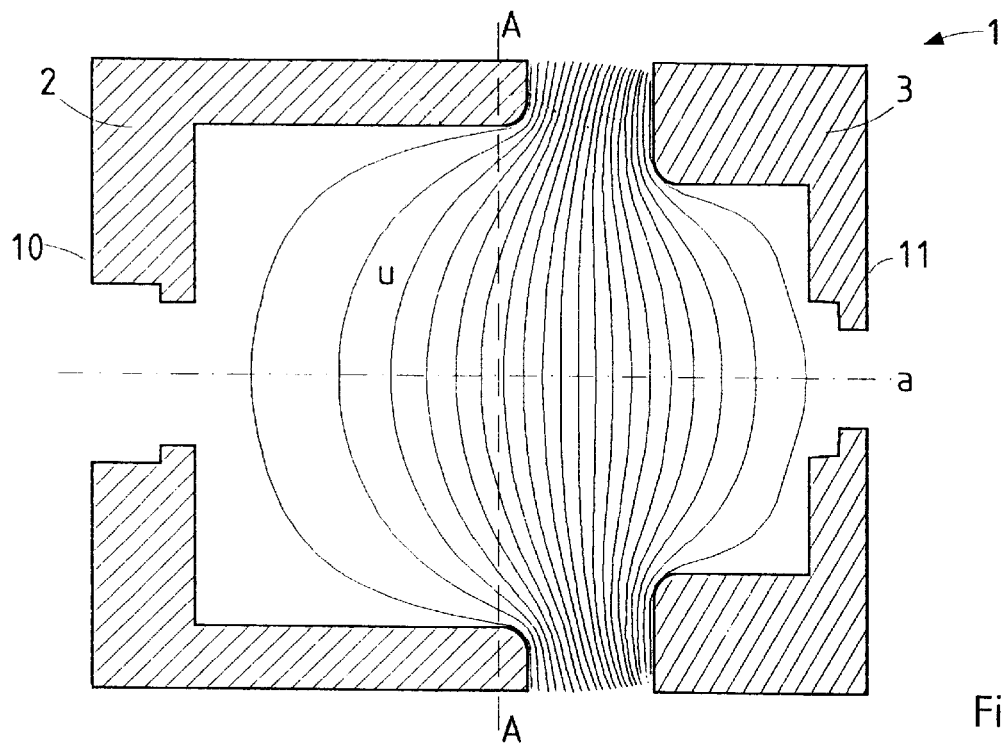
FIG. 1 is a schematic longitudinal section through an electrostatic lens.

The electrostatic lens 1 shown in FIG. 1 is mechanically adjustable and consists of two lens electrodes 2, 3 made of an electric conductor, such as aluminum. The electrodes 2, 3 are held at on strong but differing potentials U1 and U2, respectively, and produce a potential distribution in the inner space of the electrostatic lens 1, said potential distribution being indicated in FIG. 1 with the help of the equipotential lines U.

According to the present invention, at least one of the electrodes is divided into sector areas. In this case, it is the front electrode 2 shown in FIG. 2 which is divided into spaced apart sectors 4 and shows the cross-section through electrode 2 in the position shown in FIG. 1 by the line A—A. The basic shape of electrode 2 is rotationally symmetrical around the longitudinal axis a, its cross- section being essentially ring-shaped with a circular inner edge, i.e. the inner surface is either cylindrical or conical according to their course in axial direction. The entire electrode is divided into sectors 4 of preferably the same size. The sectors 4 are linked with adjusting members 5 which are fastened on an outer holding element 6 encompassing the electrode. Holding element 6 is symbolically represented in FIG. 2 and FIG. 5 as an outer ring and is not shown in the remaining figures for plainness' sake. All sectors 4 of the electrode 2 are kept on the same potential. The number of sectors usually amounts to at least six. However, this is optional in principle and may be chosen according to the desired sequence of the image distortions to be corrected.

Figure 3:
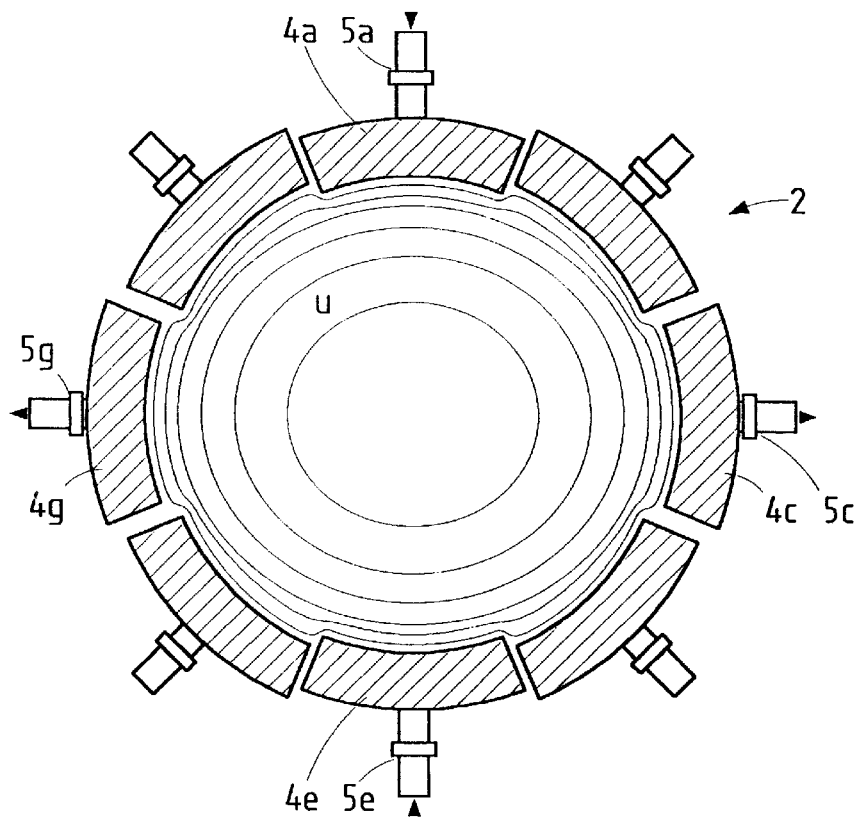
FIG. 3 shows the electrode sectors of FIG. 2 with radially shifted sectors.

Each sector 4 may be moved individually, irrespective of the others. The spatial potential distribution u of electrode 2 may also be changed after manufacturing and mounting of lens 1. This is shown in FIG. 3, wherein two opposed sectors 4a,e are shifted inwards and two opposed sectors 4c,g are shifted outwards by means of the adjusting elements 5a,c,e,g they got assigned. By changing the position of the partial electrodes 4, which occur in vertical direction to the inner surface, i.e. radial direction, the potential distribution u is also changed. Thus, the change of the potential distribution made possible in the inner space of the electrode 2 comes up to the setting up of an additional quadrupole potential distribution on the sectors 4.

The adjusting elements 5 may be piezo elements, mechanical, pneumatic or hydraulic motors. These are externally driven and may be readjusted any time, even during operation of the mechanically adjustable lens 1. Otherwise, they are strong and remain in position. The adjusting elements 5 are usually solidly mounted on the holding device 6 which ensure a safe definition of the electrode positioning. The adjusting elements 5 may be chosen so as to be stationary in passive (currentless) state, so that the mechanical adjustment can outlast a power failure, or so that, at the end of the power failure, they reintegrate their desired positions.

Figure 4:
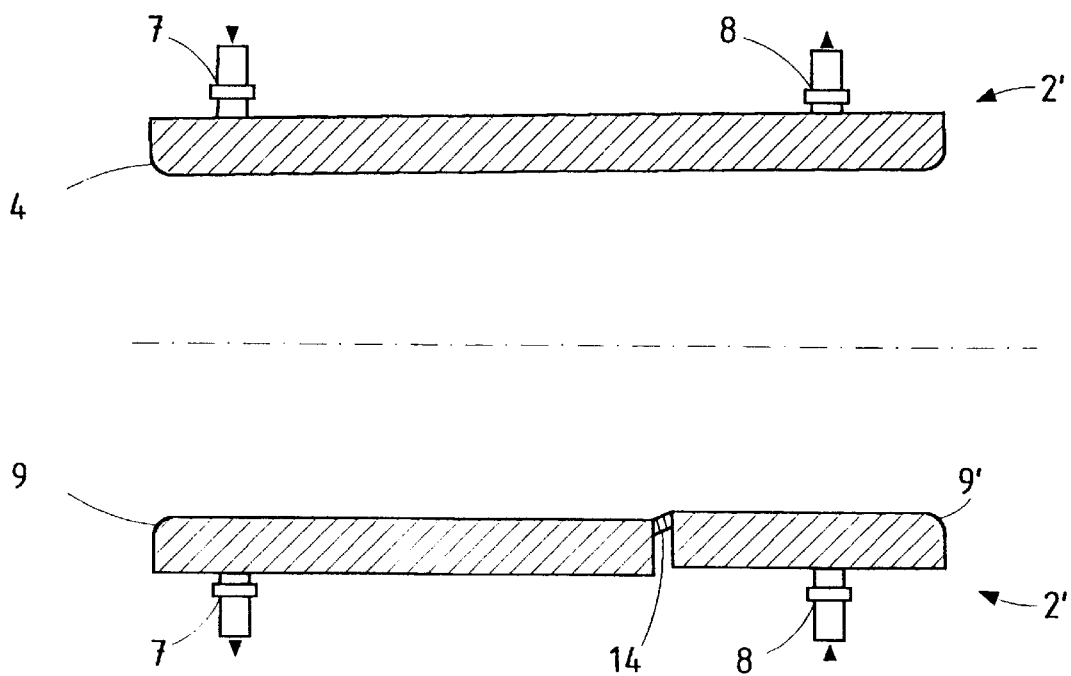
FIG. 4 is a schematic longitudinal section through an electrode which is tilted against the longitudinal axis, whereas the lower half shows a longitudinal division of the electrode into electrode intercepts.

For electrodes having an axial extension, two or more adjusting members 7, 8 may be necessary along one periphery. This is shown in FIG. 4, whose upper and lower halves each show a different embodiment of an axially extending electrode 2' according to the invention. Since each adjusting member 7, 8 of electrode 2' may be controlled independently, it is also possible to influence the shape of the potential distribution in longitudinal direction. Thus, the entire electrode may be tilted or the cross-section along the axis may be changed (see FIG. 4, upper half). The electrode 2' may, as is shown in the lower half of FIG. 4, be structured lengthwise into segments 9 along the periphery for its subdivision into sectors 4. This allows the same corrections as a tilting, but without having to tilt the electrode 2' or the electrode segments 9 themselves The front and/or rear surfaces 10, 11 (FIG. 1) of electrode 2 may also be positioned sector-wise by means of adjusting elements, so that the sectors 4 or the segments 9 are additionally movable in axial direction. The term partial electrode will be used hereinafter to refer jointly to the sectors 4 and to the sector segments 9 when latters are longitudinally structured.

The change of the cross-section of an originally completely round configuration into an essentially elliptic shape as shown in FIG. 3 corresponds to a superposition of the strong potential U1 with a quadrupole potential distribution. The change of the cross-section is not limited to such elliptic shapes, since each partial electrode 4, 9 may advantageously be positioned individually so that higher distribution sequences may also be introduced depending on the number and arrangement of the partial electrodes 4. A field distortion of first or even higher order may be corrected by moving the sectors 4 into the corresponding positions. In the same way, most of the distortions occasioned by defects of fabrication like divergences from the exactly circular cross-section, misalignments or tilting of the electrodes may be compensated by the controlled correction of the position of the different partial electrodes. To achieve this, one partial electrode (a sector 4, FIG. 4), is advantageously provided with at least two adjusting elements so that the radial position is not only adjustable but also the alignment and tilting against the longitudinal axis of the lens, via the adjusting difference of the adjusting elements 7, 8 of a partial electrode.

It is not necessary that all the electrodes of a particle or ion optical system be designed according to the invention. Often it is enough to divide just one of the electrodes. Thus, the errors of the whole system may be corrected.

In particular cases, not every partial electrode needs to be positionable in the described way. A partial electrode or a couple of opposed partial electrodes may be designed as stationary.

Figure 5:
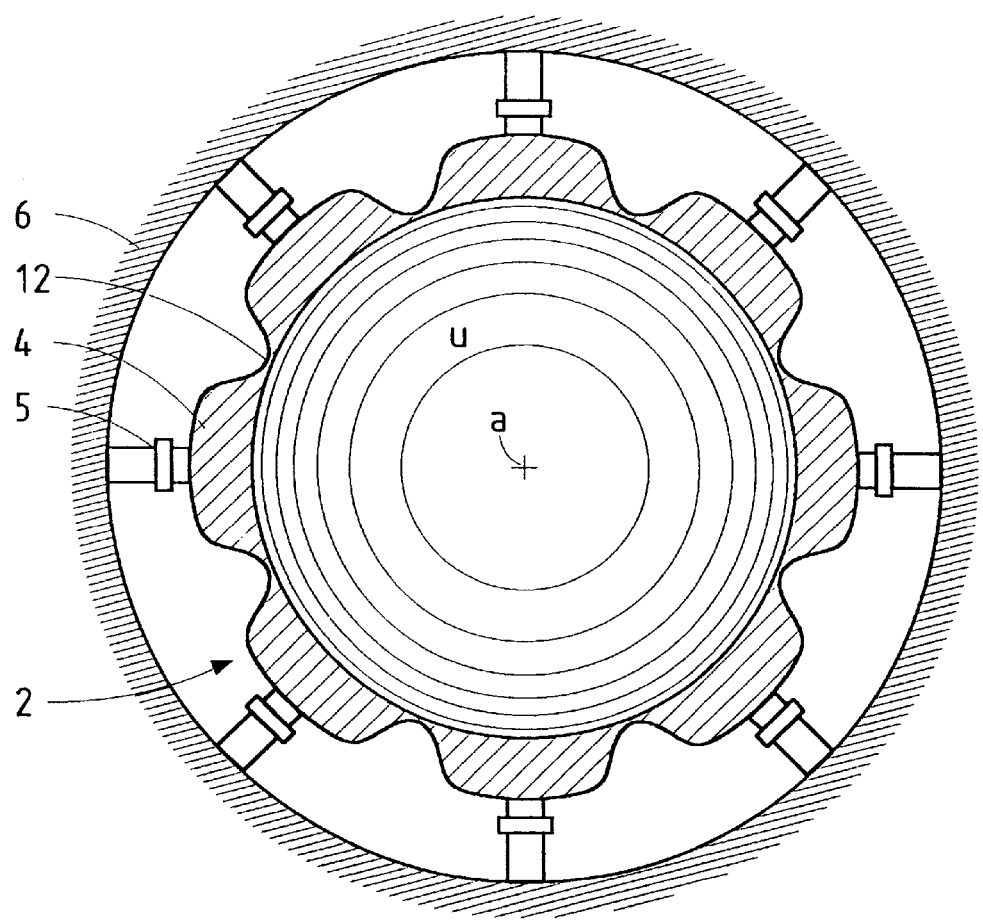
FIG. 5 is a cross-section as in FIG. 2, but with blending sector areas.

In order for the inner surface of the electrode 2 to become more uniform, it may be designed as shown in FIG. 5. Instead of being divided in physically separated sectors, the body of the electrode 2, for example, is made of aluminum and has a periodically varying thickness. The adjusting elements are arranged on the thickest places on the outer surface of the electrode body 2. The areas of high thickness 4 are essentially rigid and act as sector areas 4 like the separated sectors 4 of the FIGS. 2 and 3. The shape of the inner surface may be varied by pulling, pushing or fixing these areas. This change occurs continuously due to the ductility of the electrode material via the narrow places 12 between the sector areas 4 so that the potential distribution is more even. The intercepts 9 of a longitudinally structured electrode 2 may also be connected to one another via narrow places 12.

Figure 2:
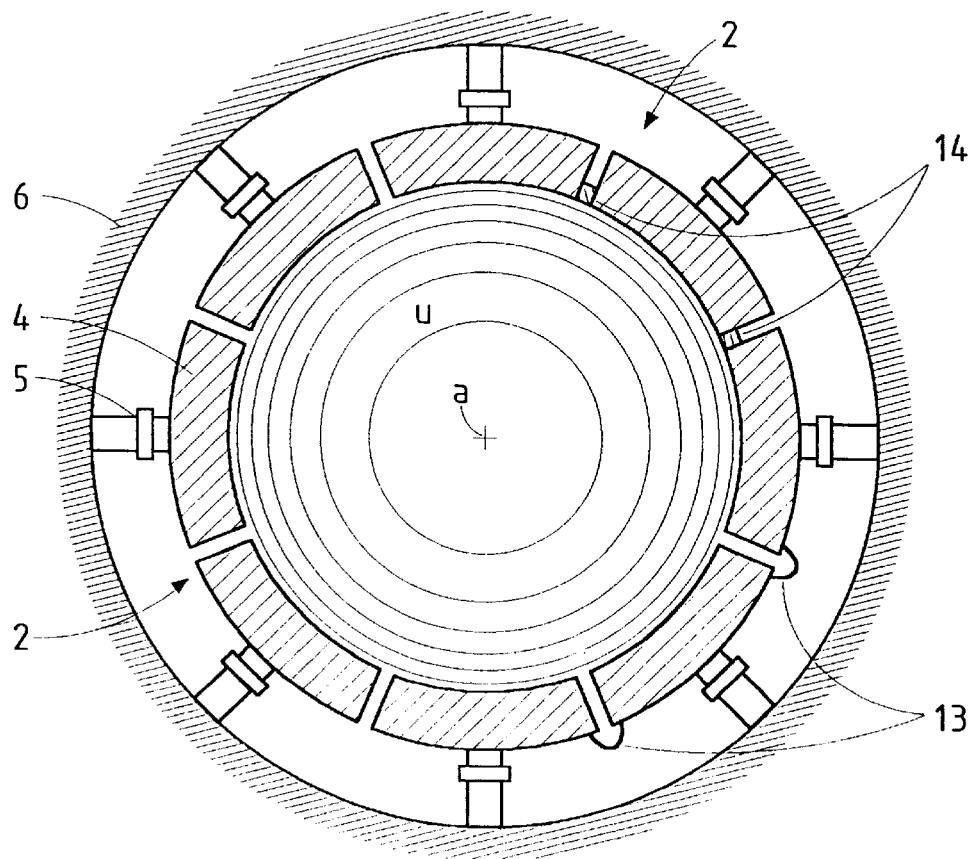
FIG. 2 is a schematic cross-section through an electrode of the lens of FIG. 1 composed of sectors according to the teachings of the invention.

The electric connections between the partial electrodes may be electric conductors 13. Also, they may be advantageously designed as joining pieces 14 running alongside the inner surface and be at least conductive on the inner surface. They are advantageously elastically ductile. These joining pieces 14 have the advantage to provide a more even potential distribution on the inner periphery of the electrode 7. The electric connections 13, 14 are shown in FIG. 2 on only two locations in order to spare the repetition of the same drawing.

The design of the spacing or separation between the sectors 4 (peripheral direction) on one hand and their intercepts 9 (longitudinal direction) on the other need not to be similar. The sectors 4 of the mechanically adjustable electrostatic lens 1 may be separated from one another physically and connected to one another by joining pieces 14, whereas the sectors 4 are divided in longitudinal direction in intercepts 9 which are continuously blending and are picked out by thin rings 12. On the whole, the invention is not limited to the described embodiments but relates to all embodiments described in the independent claim 1 that may be produced by any one skilled in the art.

We claim:

1. Electrostatic lens for focusing the beams of charged particles, more particularly of ions, which have at least two electrodes forming an electric conductor with a ring-shaped cross-section, the inner edge of which is essentially circular, each electrode being connected to a power supply being connectable to an electric potential and being fastened on a holding device, characterized in that:

at least one of the electrodes comprises sector areas succeeding one another along the periphery of the electrode, and, each sector area covering one predetermined angle area of the periphery, the sector areas being electrically connected to one another, the sector areas being linked to the holding device via at least one adjusting element per sector areas and the position of said sector areas being adjustable independent of the other sector areas by means of the at least one adjusting element during operation of the electrostatic lens.

2. Electrostatic lens according to claim 1, characterized in that the sector areas each cover an angle area of the periphery and each angle has the same size.

3. Electrostatic lens according to claim 1, characterized in that the sector areas are adjustable by means of the adjusting elements at least in a radial direction.

4. Electrostatic lens according to claim 1, characterized in that the sector areas are assigned at least two adjusting elements each and are arranged in a longitudinal direction relative to one another.

5. Electrostatic lens according to claim 4, characterized in that the sector areas are adjustable by means of the adjusting elements at least in their tilting relative to the longitudinal axis of the electrostatic lens.

6. Electrostatic lens according to claim 1, characterized in that each sector area is linked to the holding device via at least one adjusting element and is adjustable in its position by means of at least one adjusting element during operation of the electrostatic lens independent of the other sector areas.

7. Electrostatic lens according to claim 1, characterized in that sector areas are longitudinally divided into segments, and, each segment occupies a predetermined longitudinal area, the segments are connected to the common power supply, segments are linked to the holding device via at least one adjusting element, and the position of each of said segments is individually adjustable by means of the adjusting elements during operation of the electrostatic lens.

8. Electrostatic lens according to claim 1, characterized in that the sector areas and/or segments are mechanically separated.

9. Electrostatic lens according to claim 1, characterized in that the sector areas and/or the segments are mechanically connected to one another on the inner surface of the electrode by electric connections.

10. Electrostatic lens according to claim 9, characterized in that an electrode cross section with periodically variable thickness is provided, whereas each sector area extends from one thickness minimum to the next one.

* * * * *